United States Patent
Zhang et al.

(10) Patent No.: US 9,159,861 B2
(45) Date of Patent: Oct. 13, 2015

(54) METHOD FOR SINGULATING HYBRID INTEGRATED PHOTONIC CHIPS

(71) Applicant: Oracle International Corporation, Redwood City, CA (US)

(72) Inventors: Chaoqi Zhang, Atlanta, GA (US); Hiren D. Thacker, San Diego, CA (US); Ashok V. Krishnamoorthy, San Diego, CA (US)

(73) Assignee: ORACLE INTERNATIONAL CORPORATION, Redwood Shores, CA (US)

( * ) Notice: Subject to any disclaimer, the term of this patent is extended or adjusted under 35 U.S.C. 154(b) by 105 days.

(21) Appl. No.: 14/059,288

(22) Filed: Oct. 21, 2013

(65) Prior Publication Data

US 2015/0108506 A1 Apr. 23, 2015

(51) Int. Cl.
*H01L 21/00* (2006.01)
*H01L 31/12* (2006.01)
*H01L 31/18* (2006.01)

(52) U.S. Cl.
CPC ................ *H01L 31/12* (2013.01); *H01L 31/18* (2013.01)

(58) Field of Classification Search
CPC ................ H01L 31/18; H01L 31/1804; H01L 31/022425; H01L 31/02327; Y02E 10/50
USPC ................................................ 438/25, 27, 65
See application file for complete search history.

(56) References Cited

U.S. PATENT DOCUMENTS

2012/0207426 A1* 8/2012 Doany et al. ..................... 385/14
2015/0063745 A1* 3/2015 Lin et al. .......................... 385/14

OTHER PUBLICATIONS

Kumagai, Masayoshi et al., "Advanced Dicing Technology for Semiconductor Wafer—Stealth Dicing", IEEE Transactions on Semiconductor Manufacturing, vol. 20, No. 3, Aug. 2007.
Tsai, W.L. et al., "How to Select Adhesive Materials for Temporary Bonding and De-Bonding of 200mm and 300mm Thin-Wafer Handling for 3D IC Integration?" 2011 Electronic Components and Technology Conference. IEEE.

* cited by examiner

*Primary Examiner* — Andy Huynh
(74) *Attorney, Agent, or Firm* — Park, Vaughan, Fleming & Dowler LLP; Steven E. Stupp

(57) ABSTRACT

During a fabrication technique, trenches are defined partially through the thickness of a substrate. Then, photonic integrated circuits are coupled to the substrate. These photonic integrated circuits may be in a diving-board configuration, so that they at least partially overlap the trenches. While this may preclude the use of existing dicing techniques, individual hybrid integrated photonic chips (which each include a portion of the substrate and at least one of the photonic integrated circuits) may be singulated from the substrate by: coupling a carrier to a front surface of the substrate; thinning the substrate from a back surface until the partial trenches are reached (for example, by grinding the substrate); attaching a support mechanism (such as tape) to the back surface of the substrate; removing the carrier; and then removing the support mechanism.

18 Claims, 16 Drawing Sheets

METHOD FOR SINGULATING HYBRID INTEGRATED PHOTONIC CHIPS

GOVERNMENT LICENSE RIGHTS

This invention was made with United States government support under Agreement No. HR0011-08-9-0001 awarded by DARPA. The United States government has certain rights in the invention.

BACKGROUND

1. Field

The present disclosure relates to techniques for singulating hybrid optical chips. More specifically, the present disclosure relates to techniques for singulating hybrid optical chips from a common wafer.

2. Related Art

Hybrid integration by flip-chip bonding is a practical approach for combining CMOS VLSI chips with non-CMOS components. Using this fabrication technique, each component may be built on its individually optimized technology platform. This approach can be used to accelerate the availability of the integrated component compared to the design and process integration efforts that would be required for monolithic integration (if such monolithic integration of the disparate technologies were even possible).

2.5D heterogeneous integration (which is sometimes referred to as 'hybrid integration') is a fabrication technique in which chips built on different technology platforms are juxtaposed on a common substrate, such as a silicon interposer. The surface mounted chips can be interconnected using high-density and high-bandwidth wiring on this common interposer.

A time- and cost-efficient approach for fabricating hybrid or 2.5D chips is a chip-on-wafer fabrication technique. In this fabrication technique, diced chips of one type are attached to chips of the second type that are still in wafer form. In the case of 2.5D heterogeneous integration, multiple diced chips may be attached to an interposer that is still in wafer form. In each case, singulation of the widget (e.g., the chip, the interposer, etc.), which is still in wafer form, may be performed after bonding to yield the assembled chip. In general, standard singulation process flows involving a dicing saw cut or laser ablation may be used, because even after the chip-on-wafer bonding, the dicing lanes between the chips are still clear and available.

As shown in FIG. 1, hybrid integrated photonic chips, such as bridge chips, are hybrid-integrated components that embody an electrical interface for local communications and optical access for global interconnections (via either optical fiber or optical waveguides on another routing layer). These bridge chips may be fabricated by attaching silicon photonic integrated circuits to a VLSI chip. Moreover, photonic bridge chips are typically assembled in diving-board configurations, such that at least one edge of the photonic integrated circuits is sufficiently exposed and hangs off an edge of the VLSI chip to provide access for surface-normal or edge-coupling optical input/output (I/O) circuits. Therefore, in a chip-on-wafer fabrication technique, where the chips being bonded to the target wafer (such as the active-CMOS or the passive-interposer substrate) include photonic integrated circuits that hang over the singulation boundary of the bottom chip/interposer, component singulation after bonding using an existing singulation process flow is usually not possible. This is because cutting along the dicing lanes on the wafer would also imply cutting through the photonic integrated circuits.

Hence, what is needed is a fabrication technique without the above-described problems.

SUMMARY

One embodiment of the present disclosure provides a method for singulating hybrid integrated photonic chips. During the method, trenches are defined from a front surface of a substrate extending partially through a thickness of the substrate. Then, photonic integrated circuits are coupled to the substrate, where a given photonic integrated circuit has a front surface facing the front surface of the substrate, and where the given photonic circuit at least partially overlaps a given trench. Moreover, a carrier is coupled to the front surface of the substrate. Furthermore, the thickness of the substrate is reduced from a back surface of the substrate. Additionally, a support mechanism is coupled to the back surface of the substrate, and the carrier is removed from the front surface of the substrate. Next, the hybrid integrated photonic chips are singulated by removing the support mechanism from the back surface of the substrate, where a given hybrid integrated photonic chip includes a portion of the substrate and one of the photonic integrated circuits.

Note that the trenches may be defined using: partial dicing of the substrate; deep anisotropic etching (such as deep reactive ion etching for a silicon substrate); and/or laser cutting.

Moreover, the substrate may include complementary-metal-oxide-semiconductor (CMOS) devices.

Furthermore, the photonic integrated circuits may be bonded to the substrate.

Additionally, the carrier may be coupled to the substrate using an adhesive. In some embodiments, the carrier includes cavities, defined by edges, that at least partially surround the photonic integrated circuits.

Moreover, the thickness of the substrate may be reduced using grinding.

Furthermore, the support mechanism may include tape.

Additionally, prior to coupling the photonic integrated circuits to the substrate, the method may include fabricating through-substrate vias (TSVs) partially through the thickness of the substrate. the TSVs may have a depth that is greater than or less than that of the trenches.

Another embodiment provides a fabrication structure. This fabrication structure may include: the substrate having the front surface; the photonic integrated circuits coupled to the substrate, where the given photonic integrated circuit has the front surface facing the front surface of the substrate, and where the substrate includes trenches partially through the thickness of the substrate under at least a portion of the photonic integrated circuits; and the carrier coupled to the front surface of the substrate.

Another embodiment provides a method for singulating hybrid integrated photonic chips. During the method, a first carrier is coupled to a front surface of a substrate, and a thickness of the substrate is reduced from a back surface of the substrate. Then, a second carrier is coupled to the back surface of the substrate, and the first carrier is removed. Moreover, trenches are defined from the front surface extending through the thickness of the substrate. Furthermore, photonic integrated circuits are coupled to the substrate, where a given photonic integrated circuit has a front surface facing the front surface of the substrate, and where the given photonic circuit at least partially overlaps a given trench. Furthermore, a third carrier is coupled to the front surface of the substrate, and the second carrier is removed. Additionally, a support mechanism is coupled to the back surface of the substrate, and the third carrier is removed from the front surface of the substrate.

Next, the hybrid integrated photonic chips are singulated by removing the support mechanism from the back surface of the substrate, where a given hybrid integrated photonic chip includes a portion of the substrate and one of the photonic integrated circuits.

Note that the substrate may include an interposer without CMOS devices.

BRIEF DESCRIPTION OF THE FIGURES

Note that like reference numerals refer to corresponding parts throughout the drawings. Moreover, multiple instances of the same part are designated by a common prefix separated from an instance number by a dash.

DETAILED DESCRIPTION

Figure 1:
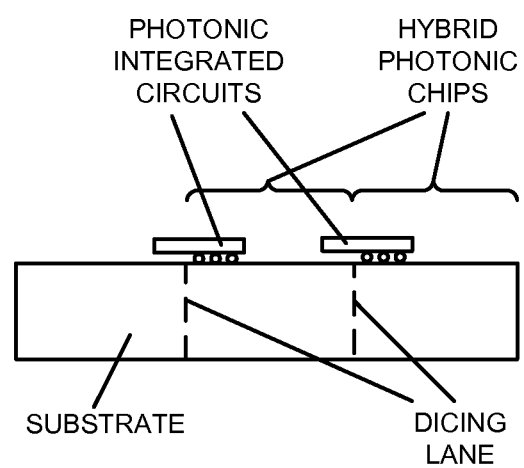
FIG. 1 is a block diagram illustrating singulation of hybrid integrated photonic chips.

Embodiments of a method for singulating hybrid integrated photonic chips and a fabrication structure are described. During the method, trenches are defined partially through the thickness of a substrate. Then, photonic integrated circuits are coupled to the substrate. These photonic integrated circuits may be in a diving-board configuration, so that they at least partially overlap the trenches. While this may preclude the use of existing dicing techniques, individual hybrid integrated photonic chips (which each include a portion of the substrate and at least one of the photonic integrated circuits) may be singulated from the substrate by: coupling a carrier to a front surface of the substrate; thinning the substrate from a back surface until the partial trenches are reached (for example, by grinding the substrate); attaching a support mechanism (such as tape) to the back surface of the substrate; removing the carrier; and then removing the support mechanism.

By facilitating wafer-scale singulation of the hybrid integrated photonic chips, this fabrication technique may allow a chip-on-wafer fabrication technique to be used. Consequently, the fabrication technique may increase the yield and, thus, may reduce the cost of the hybrid integrated photonic chips.

We now describe embodiments of the fabrication technique. This fabrication technique may be used to singulate a large-size wafer (which could be either a CMOS wafer with active circuits, or a passive interposer with redistribution layers or RDLs and through-silicon vias or TSVs) with assembled photonic chips. A given photonic chip may hang over the edge of each individual chip/interposer on the wafer and, therefore, may preclude the use of existing front-side dicing or singulation techniques because portions of the dicing lanes may be underneath the photonic chips. Instead, the fabrication technique may be used to singulate chips without damaging the dies hanging over the dicing lane.

The fabrication technique may include the operations of: die assembly, dicing-lane creation, and chip singulation. In the case where the wafer includes a passive interposer for 2.5D hybrid integration, wafer thinning and fabrication of an RDL on the backside of a chip may be needed, too.

In general, the singulation approaches in the fabrication technique may be classified in two groups: wafer-level hybrid integration in which the assembly substrate is a full-thickness CMOS wafer (i.e., a thickness of approximately 775 µm for a 300 mm wafer); and 2.5D interposer hybrid integration in which the assembly substrate is a passive interposer that is as thin as 100 µm.

In the case of wafer-level hybrid integration, the fabrication technique may be used on a large full-thickness wafer with assembled diving-board photonic dies. Note that the wafer may be thick enough to provide mechanical support for the assembled component. Consequently, wafer carriers may be used primarily as transfer tools. Furthermore, there may be two sequences of basic operations in the fabrication technique: assembly first (die bonding before wafer singulation) and assembly last (die bonding after wafer singulation).

Figure 2:
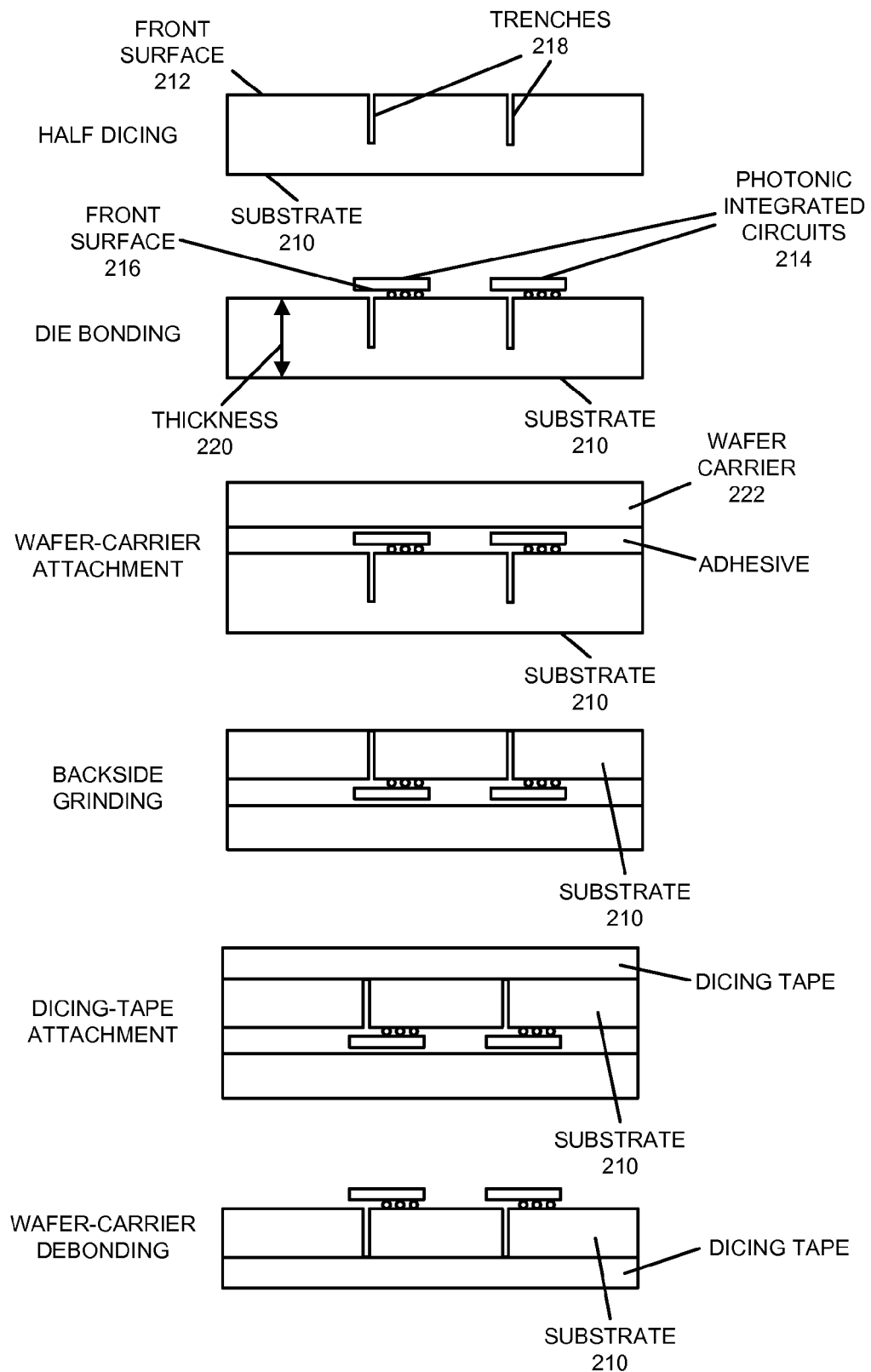
FIG. 2 is a block diagram illustrating singulation of hybrid integrated photonic chips in accordance with an embodiment of the present disclosure.

FIG. 2 presents a block diagram illustrating singulation of hybrid integrated photonic chips. In this embodiment of the fabrication technique, assembly first and backside grinding may be used in conjunction with a CMOS substrate. In particular, a full-thickness CMOS wafer may be diced from the front side down to a partial thickness of the wafer. Then, the photonic chips may be attached to the substrate using die bonding. Moreover, a wafer carrier may be temporarily bonded on to the front side of the wafer. Note that the wafer carrier may be a silicon wafer, a ceramic wafer, or a glass wafer, and a variety of bonding adhesives may be used. Furthermore, note that the adhesive layer may be thicker than the height of the assembled chip. After bonding the wafer carrier, backside grinding may be used to reveal the dicing trench and to singulate the hybrid components. Next, dicing tape may be laminated on the backside of the CMOS wafer, and a wafer debonding operation may be performed to release the wafer carrier.

Figure 3A:
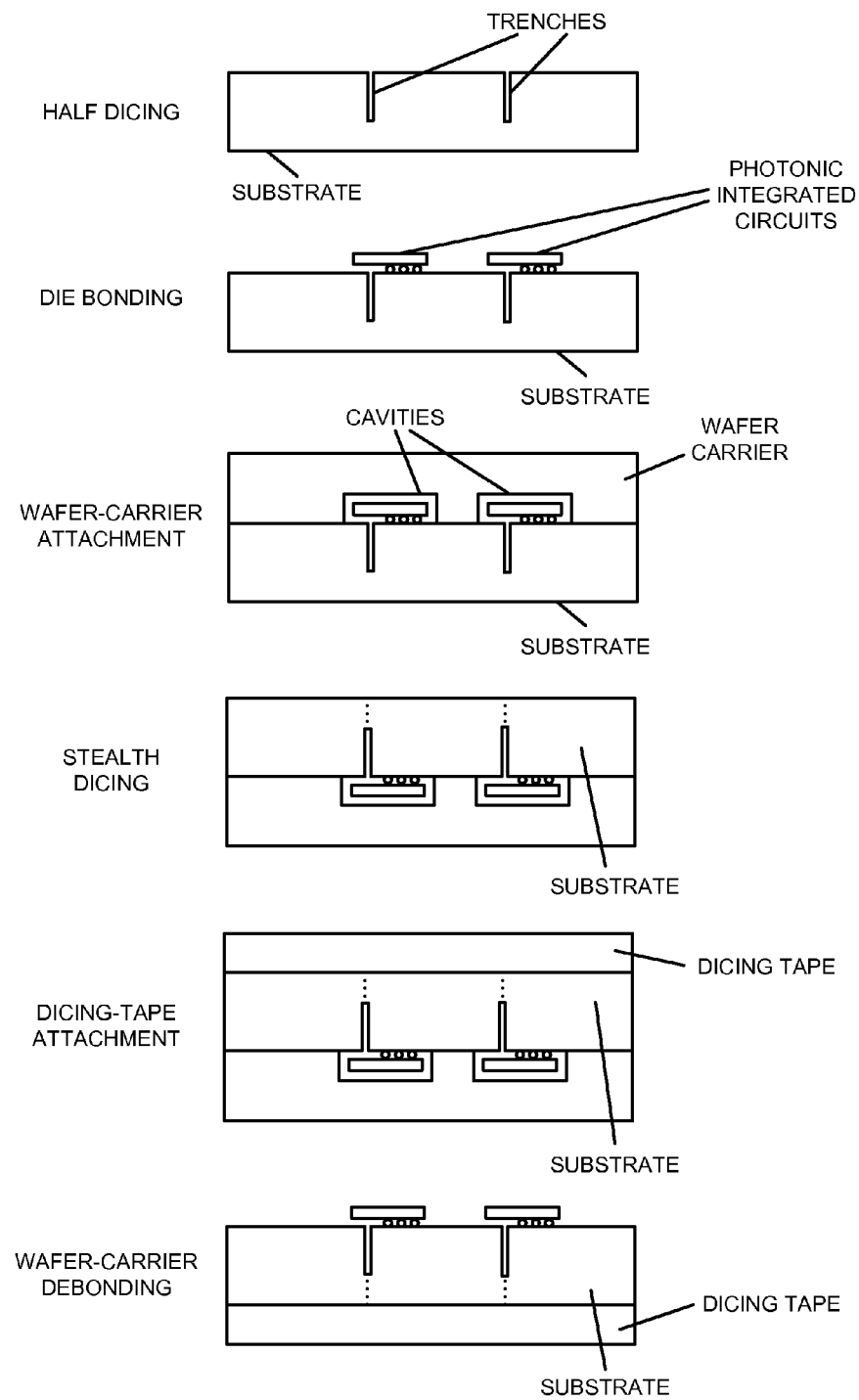
FIG. 3A is a block diagram illustrating singulation of hybrid integrated photonic chips in accordance with an embodiment of the present disclosure.
Figure 3B:
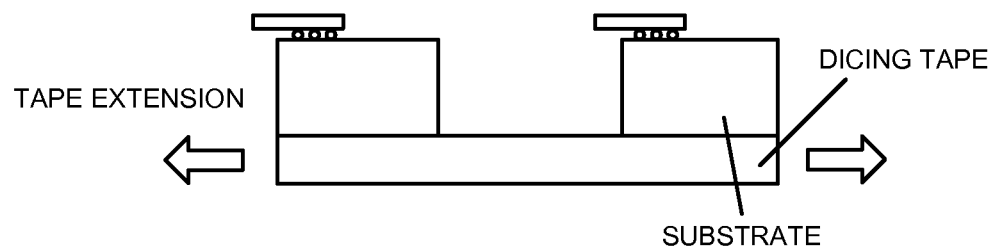
FIG. 3B is a block diagram illustrating singulation of hybrid integrated photonic chips.

FIGS. 3A and 3B present block diagrams illustrating singulation of hybrid integrated photonic chips. In this embodiment of the fabrication technique, assembly first and so-called 'stealth dicing' (in which defects are formed within the thickness of the substrate, e.g., using a laser, to create a cleaving line) may be used in conjunction with a CMOS substrate. In particular, a full-thickness CMOS wafer may be diced down from the front side to a partial thickness of the wafer followed by die bonding. Then, a wafer carrier with cavities mirroring the location of the dies bonded on the CMOS wafer may be temporarily attached (using an adhesive, a mechanical clamp or a magnetic clamp) on to the surface of the CMOS wafer. Moreover, stealth dicing may be used from the wafer backside to generate lines of defects in the remaining wafer thickness along the dicing lanes that will serve as cleaving facets later in the fabrication process. After the stealth dicing, dicing tape may be laminated on to the backside of the CMOS wafer. Furthermore, after releasing the wafer carrier, the chips may be cleaved and singulated by extending the dicing tape. While this embodiment of the fabrication technique includes additional operations than the embodiment described with reference to FIG. 2, singulation via stealth dicing is typically a cleaner process and can ensure that the front surface of the photonic die is well protected from contamination.

Figure 4:
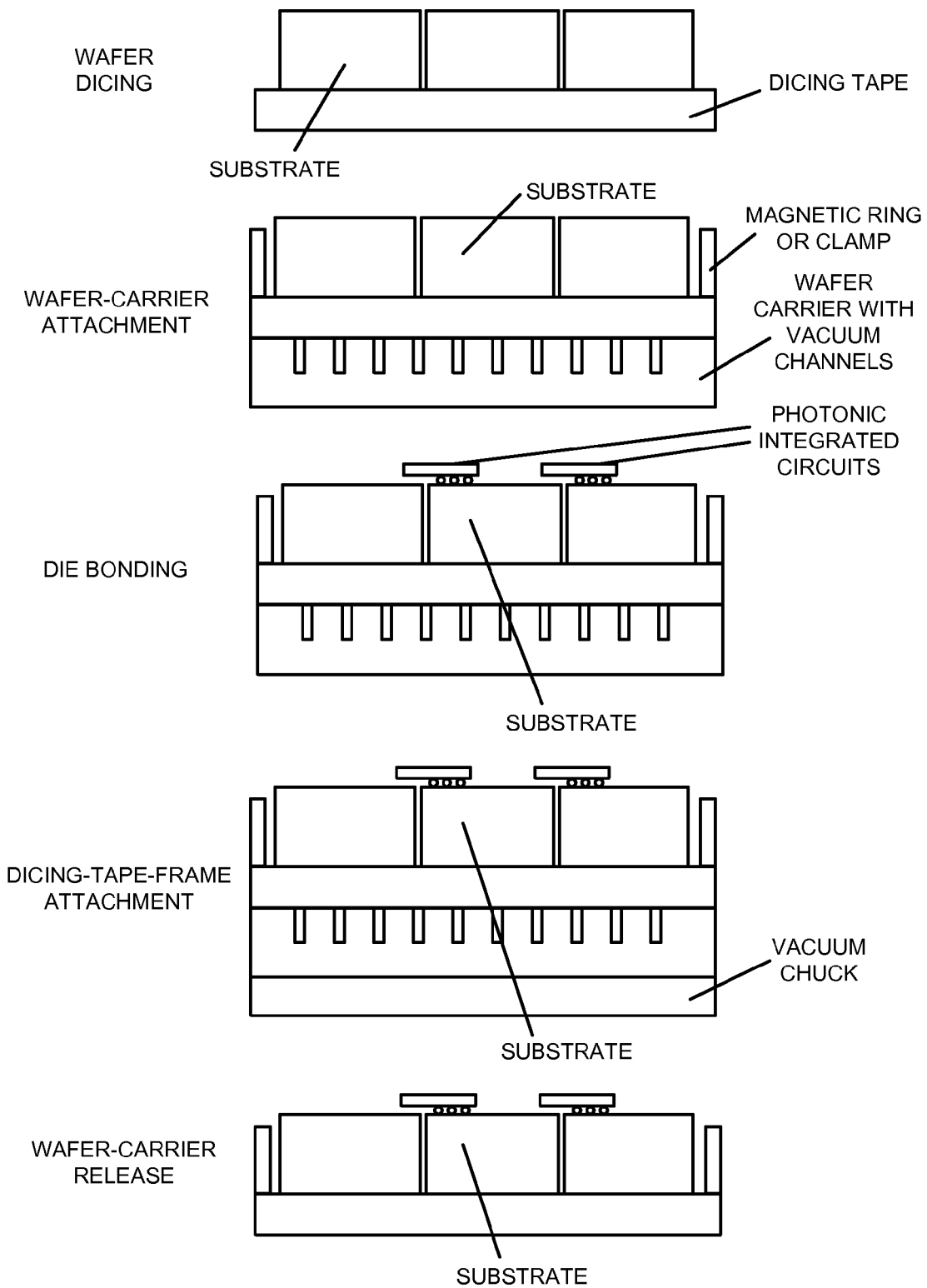
FIG. 4 is a block diagram illustrating singulation of hybrid integrated photonic chips in accordance with an embodiment of the present disclosure.

FIG. 4 presents a block diagram illustrating singulation of hybrid integrated photonic chips. In this embodiment of the fabrication technique, assembly last and dicing tape may be used in conjunction with a CMOS substrate. In particular, a full-thickness CMOS wafer may be attached on to high-temperature dicing tape, and then may be diced through from the front side of the wafer. After these operations, the wafer may be clamped (e.g., using a mechanical clamp or a magnetic clamp) on to a wafer carrier with pass-through vacuum channels. The wafer carrier may provide mechanical support to the diced wafer while the pass-through channels may allow it to be positioned and held by vacuum on a bonding chuck on a flip-chip bonder. Moreover, the wafer with the dicing tape and the wafer carrier may undergo a die-bonding process, during which the photonic chips are attached to the wafer. Next, the clamp may be removed, and the diced, assembled component may be released from the dicing tape. Note that the interface between the wafer carrier and the dicing tape may not be tacky, so the wafer carrier may be easily released and, if needed, reused.

Depending on how the preceding embodiments are implemented, at an intermediate operation in the fabrication technique the wafer with the photonic chips may be transferred from one fabrication facility to another. As shown in FIG. 2, during such a transfer, a fabrication structure being transferred may include: a substrate 210 (such as the wafer) having a front side or surface 212; photonic integrated circuits or chips 214 coupled to substrate 210, where a given photonic integrated circuit has a front surface (such as front surface 216) facing front surface 212 of substrate 210, and where substrate 210 includes trenches 218 partially through a thickness 220 of substrate 210 under at least a portion of photonic integrated circuits 214; and a carrier 222 (such as the wafer carrier) coupled to front surface 212 of substrate 210.

In the case of 2.5D interposer-based hybrid integration, the fabrication technique may be used to singulate a large (up to a reticle size of 32×25 mm$^2$), thinned-down (as thin as 100 µm) interposer wafer with assembled diving-board photonic dies. Because the thinned wafer may not be able to support itself, a wafer carrier may be needed. Once again, there may be two sequences of basic operations in the fabrication technique: assembly first (die bonding before wafer singulation) and assembly last (die bonding after wafer singulation).

Figure 5A:
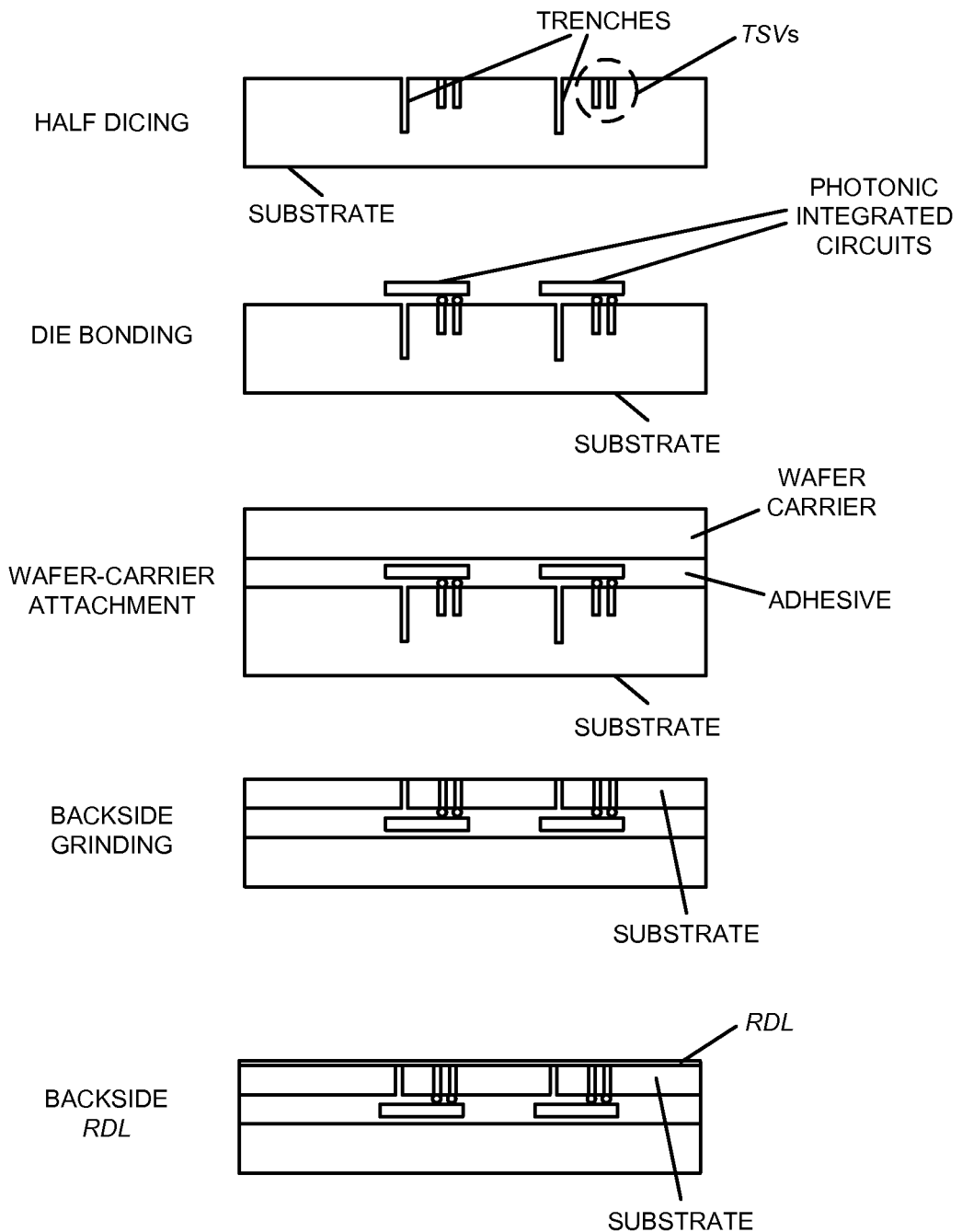
FIG. 5A is a block diagram illustrating singulation of hybrid integrated photonic chips in accordance with an embodiment of the present disclosure.
Figure 5B:
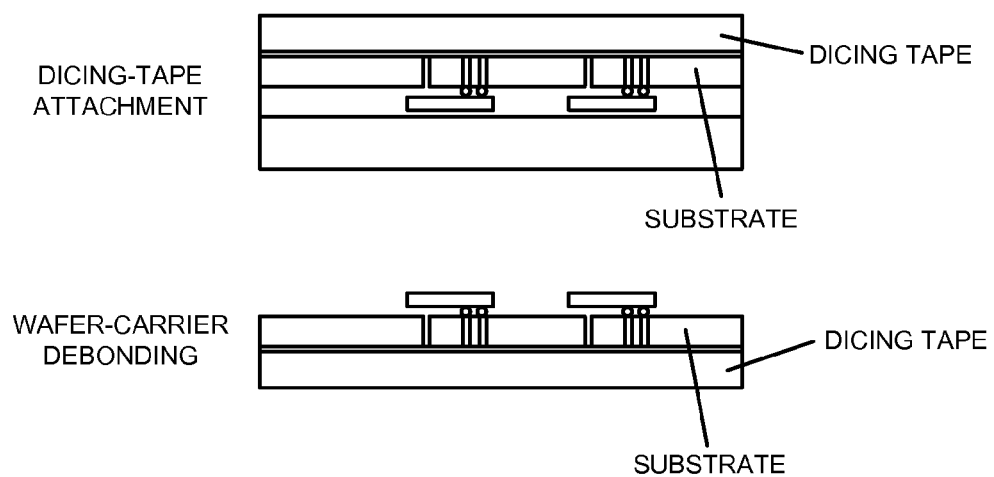
FIG. 5B is a block diagram illustrating singulation of hybrid integrated photonic chips in accordance with an embodiment of the present disclosure.

FIGS. 5A and 5B present block diagrams illustrating singulation of hybrid integrated photonic chips. In this embodiment of the fabrication technique, assembly first and backside grinding may be used in conjunction with an interposer substrate. In particular, a full-thickness, passive interposer wafer with a front-side RDL and blind TSVs may be diced down or partially cut from the front side through a partial thickness of the wafer. For example, the wafer may have a thickness greater than 650 µm, and the TSVs may be a few to tens microns wide with an aspect ratio ten. After this operation, the photonic chips may be bonded on to the wafer, and a wafer carrier may be temporarily bonded on to the front side of the wafer. Then, a backside-grinding process may be used to thin the wafer down to a final thickness (e.g., 100 µm), which may also reveal plated TSVs from the backside. By selecting a depth of the partial cut at the beginning of the fabrication technique to be deeper than the TSVs, the wafer back-grinding process may also reveal the dicing-cut trenches. Next, after the TSVs and the dicing trenches are revealed, the backside of the wafer may be processed to build up the RDL. Furthermore, dicing tape may be laminated on to the backside of the thin wafer, the wafer may be released from the wafer carrier, and singulated components may be picked out.

Figure 6A:
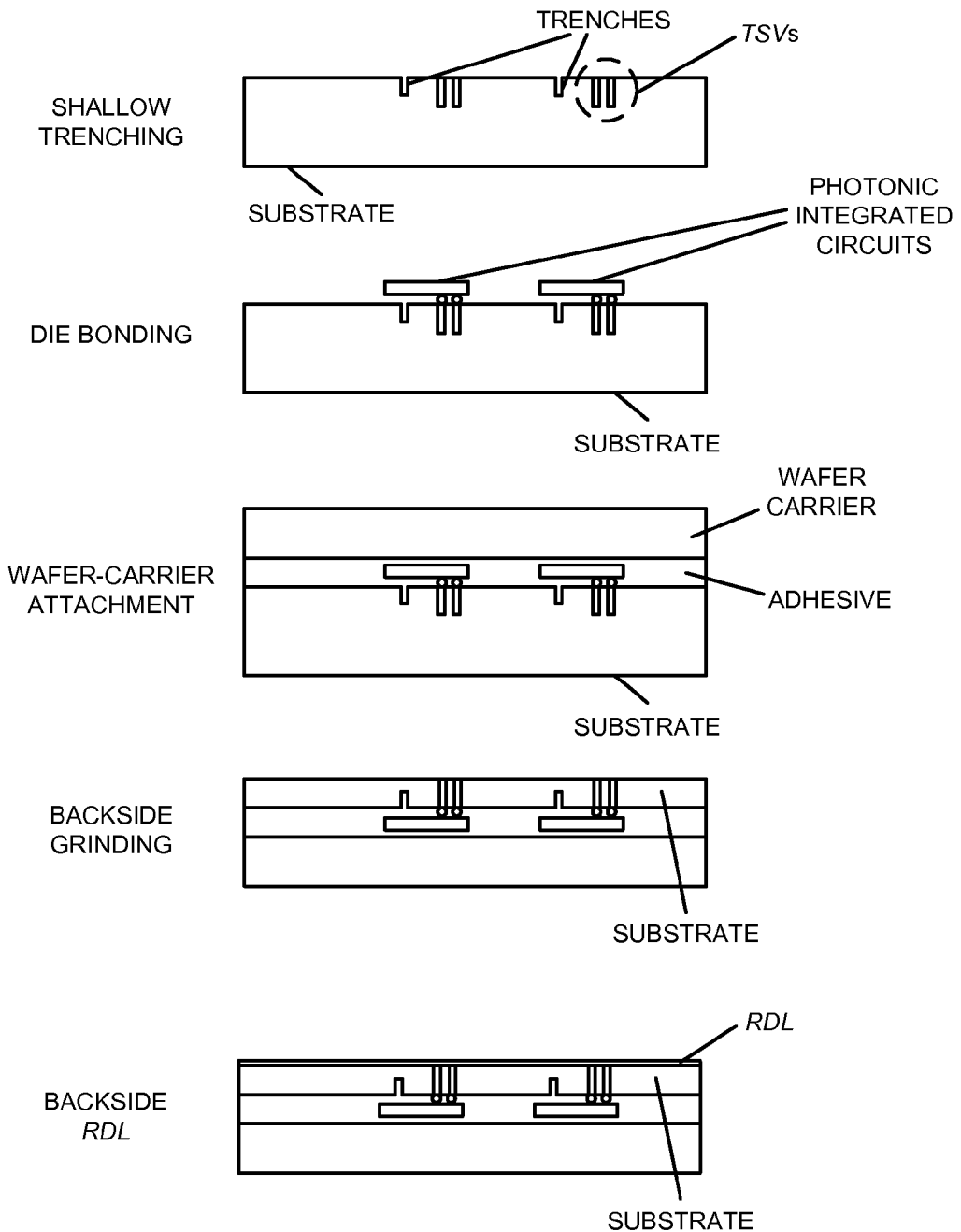
FIG. 6A is a block diagram illustrating singulation of hybrid integrated photonic chips in accordance with an embodiment of the present disclosure.
Figure 6B:
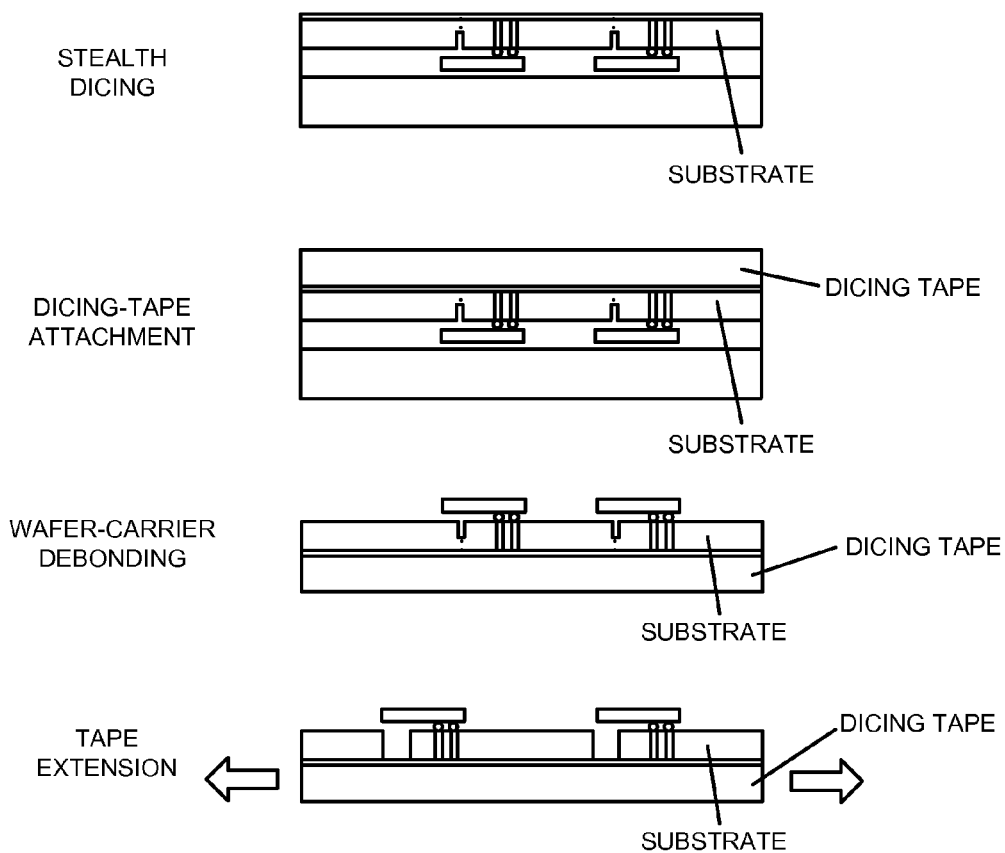
FIG. 6B is a block diagram illustrating singulation of hybrid integrated photonic chips in accordance with an embodiment of the present disclosure.

FIGS. 6A and 6B present block diagrams illustrating singulation of hybrid integrated photonic chips. In this embodiment of the fabrication technique, assembly first and stealth dicing may be used in conjunction with an interposer substrate. This embodiment may largely follow the operations described above with reference to FIGS. 5A and 5B, except that the partial cuts may initially be shorter than those of the TSVs. Consequently, the backside-grinding process that reveals the TSVs may not reveal the singulation trenches. Instead, a stealth-dicing process may be used to create a defect layer underneath these partial cut trenches. However, the stealth dicing may not be able to penetrate the metal layer, so a dicing-lane opening may be needed for the stealth dicing. Moreover, the assembled components may be cleaved at the end of the fabrication technique to separate from each other. Note that the debonding of the wafer carrier may be compatible with the dicing tape.

Figure 7A:
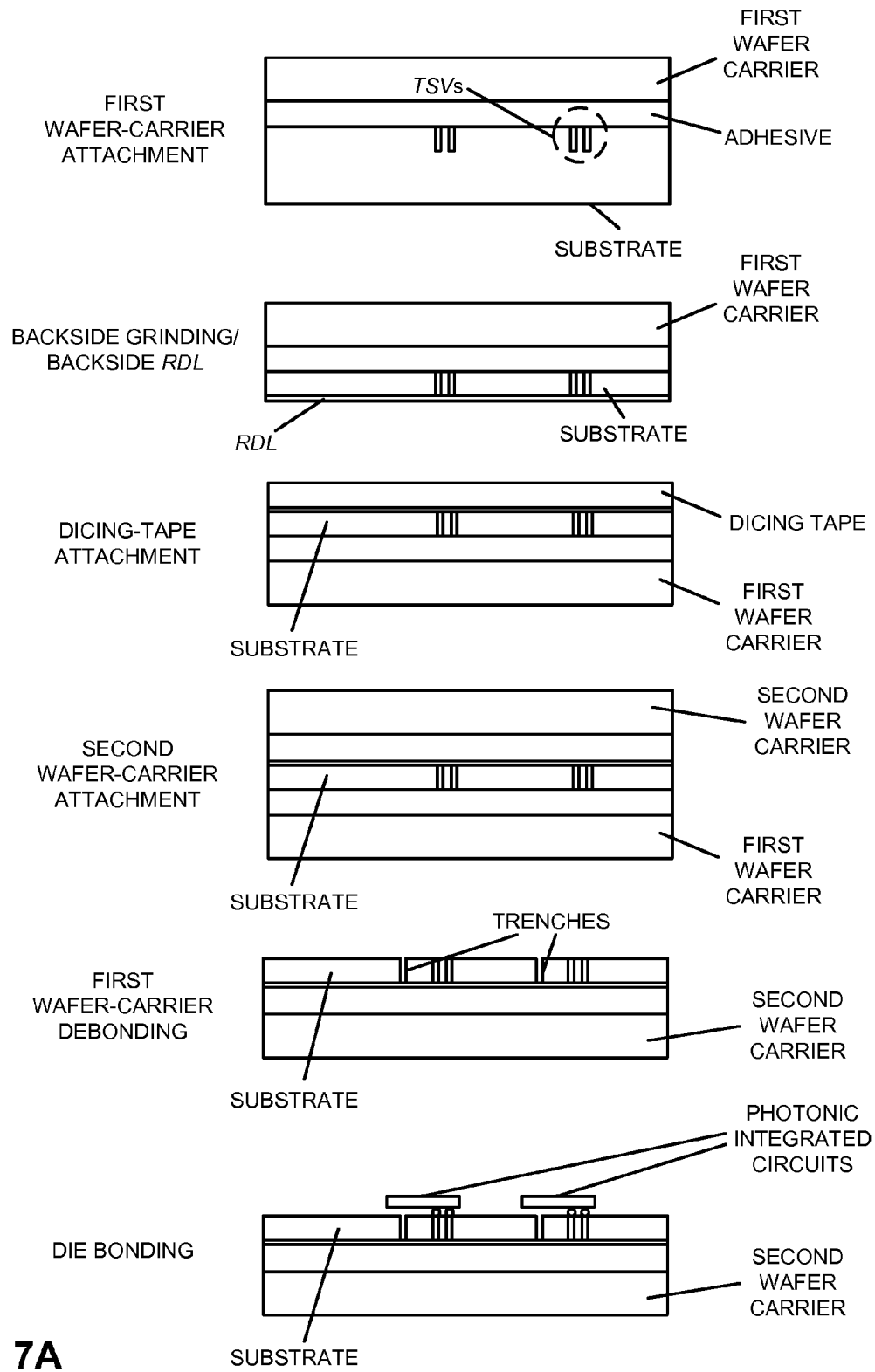
FIG. 7A is a block diagram illustrating singulation of hybrid integrated photonic chips in accordance with an embodiment of the present disclosure.
Figure 7B:
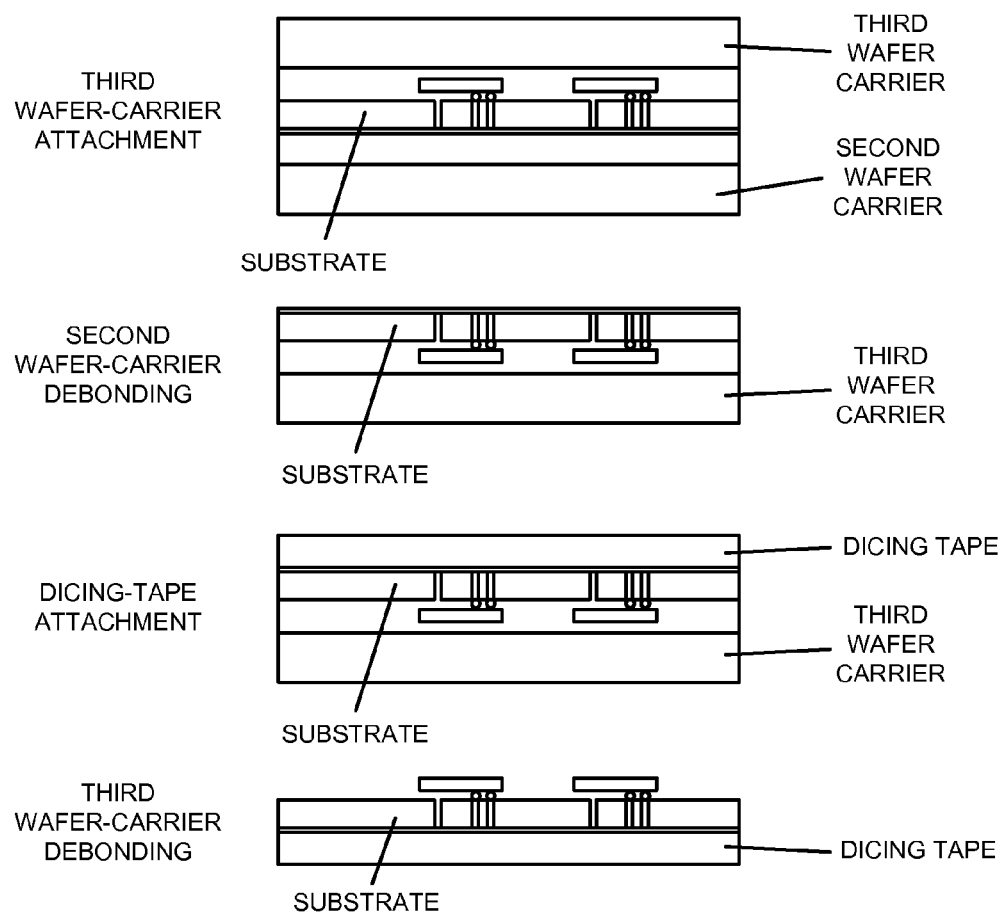
FIG. 7B is a block diagram illustrating singulation of hybrid integrated photonic chips in accordance with an embodiment of the present disclosure.

FIGS. 7A and 7B present block diagrams illustrating singulation of hybrid integrated photonic chips. In this embodiment of the fabrication technique, assembly last and backside grinding may be used in conjunction with an interposer substrate. In particular, a full-thickness interposer wafer with a front-side RDL and blind TSVs may be attached to a first temporary wafer carrier, and then may undergo the back-side grinding process to reveal the TSVs. Then, a second wafer carrier may be attached to the backside of the wafer, and the first wafer carrier may be released. Moreover, the wafer may be diced followed by chip-to-wafer bonding. Next, a third wafer carrier may be attached on the front side (which has the assembled photonic dies). After the second wafer carrier is debonded, dicing tape may be laminated on the wafer/third wafer carrier pair. Furthermore, a dicing-tape-compatible debonding process may be performed to release the third wafer carrier, and the assembled and diced components may be released from the dicing tape as needed.

Figure 8A:
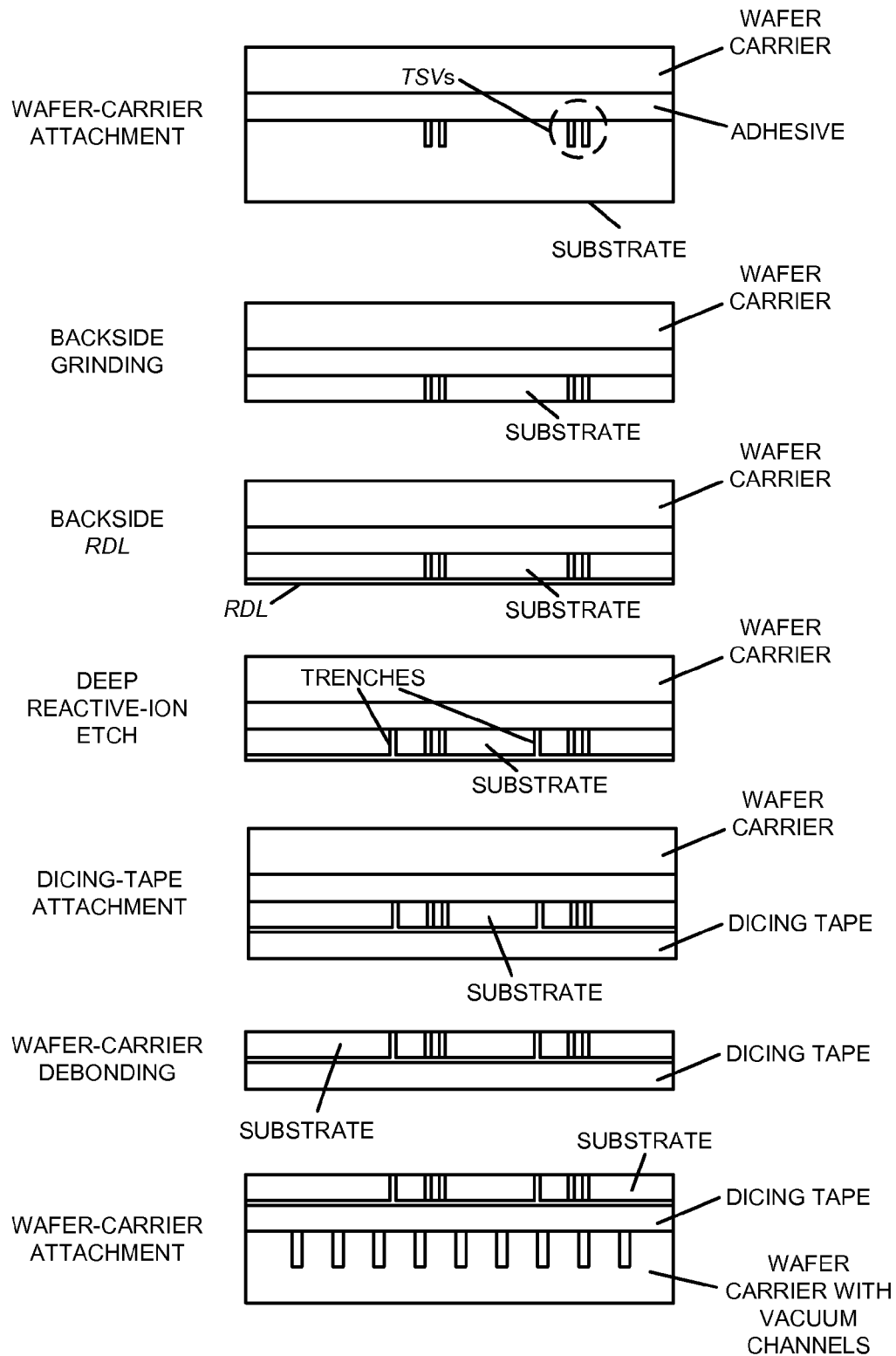
FIG. 8A is a block diagram illustrating singulation of hybrid integrated photonic chips in accordance with an embodiment of the present disclosure.
Figure 8B:
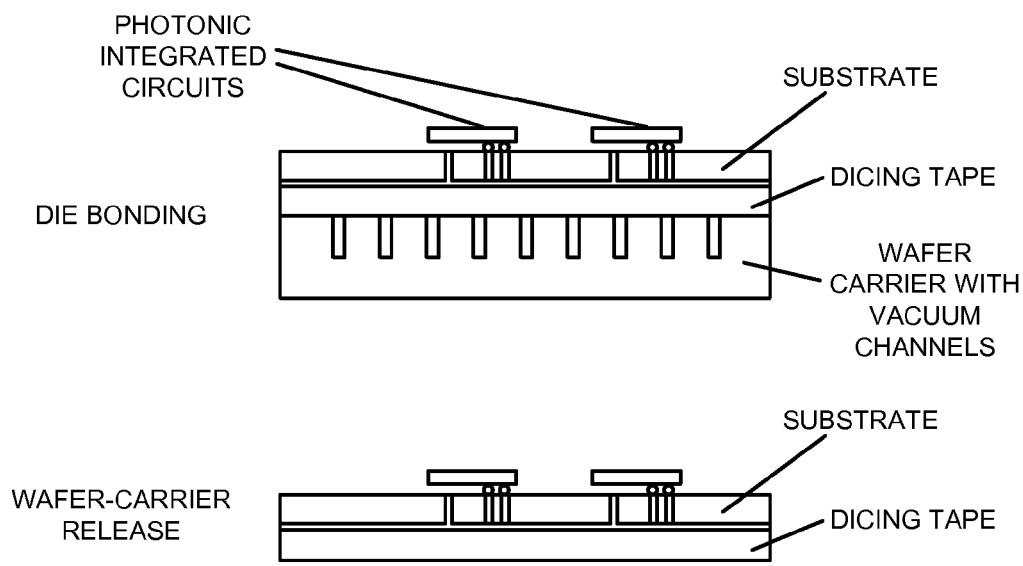
FIG. 8B is a block diagram illustrating singulation of hybrid integrated photonic chips in accordance with an embodiment of the present disclosure.

FIGS. 8A and 8B present block diagrams illustrating singulation of hybrid integrated photonic chips. In this embodiment of the fabrication technique, assembly last and dicing tape may be used in conjunction with an interposer substrate. In particular, a full-thickness interposer wafer with a front-side RDL and blind TSVs may be attached to a temporary wafer carrier, and may undergo a backside-grinding process to reveal the TSVs. Then, shallow trenches may be created to singulate the chips. Moreover, the wafer may be attached to a high-temperature dicing tape, and the wafer-carrier may be released. Next, the wafer/high-temperature dicing-tape pair may be mounted and fixed on to a rigid wafer carrier for the chip-to-wafer assembly process. Furthermore, the rigid wafer carrier may be removed, and the assembled singulated components may be released from the dicing tape.

Thus, the fabrication technique may be used to singulate hybrid integrated photonic chips so that a chip-to-wafer bonding process can be used for hybrid integration or 2.5D/3D hybrid integration even though existing dicing techniques may not be used because potential dicing lanes between the chips or interposers may not be accessible or available.

The hybrid integrated photonic chips may be used in a variety of applications. In general, functions of a given hybrid integrated photonic chip may be implemented in hardware and/or in software. Thus, a system that includes the hybrid integrated photonic chip may include one or more program modules or sets of instructions stored in an optional memory subsystem (such as DRAM or another type of volatile or non-volatile computer-readable memory), which may be executed by an optional processing subsystem. Note that the one or more computer programs may constitute a computer-program mechanism. Furthermore, instructions in the various modules in the optional memory subsystem may be implemented in: a high-level procedural language, an object-oriented programming language, and/or in an assembly or machine language. Note that the programming language may be compiled or interpreted, e.g., configurable or configured, to be executed by the processing subsystem.

Components in the given hybrid integrated photonic chip may be coupled by signal lines, links or buses. These connections may include electrical, optical, or electro-optical communication of signals and/or data. Furthermore, in the preceding embodiments, some components are shown directly connected to one another, while others are shown connected via intermediate components. In each instance, the method of interconnection, or 'coupling,' establishes some desired communication between two or more circuit nodes, or terminals. Such coupling may often be accomplished using a number of circuit configurations, as will be understood by those of skill in the art; for example, AC coupling and/or DC coupling may be used.

In some embodiments, functionality in these circuits, components and devices may be implemented in one or more: application-specific integrated circuits (ASICs), field-programmable gate arrays (FPGAs), and/or one or more digital signal processors (DSPs). Furthermore, functionality in the preceding embodiments may be implemented more in hardware and less in software, or less in hardware and more in software, as is known in the art. In general, the given hybrid integrated photonic chip may be at one location or may be distributed over multiple, geographically dispersed locations.

The hybrid integrated photonic chips may include: a VLSI circuit, a switch, a hub, a bridge, a router, a communication system (such as a wavelength-division-multiplexing communication system), a storage area network, a data center, a network (such as a local area network), and/or a computer system (such as a multiple-core processor computer system). Furthermore, the computer system may include, but is not limited to: a server (such as a multi-socket, multi-rack server), a laptop computer, a communication device or system, a personal computer, a work station, a mainframe computer, a blade, an enterprise computer, a data center, a portable-computing device, a tablet computer, a supercomputer, a network-attached-storage (NAS) system, a storage-area-network (SAN) system, a media player (such as an MP3 player), an appliance, a subnotebook/netbook, a tablet computer, a smartphone, a cellular telephone, a network appliance, a set-top box, a personal digital assistant (PDA), a toy, a controller, a digital signal processor, a game console, a device controller, a computational engine within an appliance, a consumer-electronic device, a portable electronic device, a personal organizer, and/or another electronic device.

Moreover, the hybrid integrated photonic chips can be used in a wide variety of applications, such as: optical communications (for example, in an optical interconnect or an optical link), data storage (such as an optical-storage device or system), medicine (such as a diagnostic technique or surgery), a barcode scanner, and/or metrology (such as precision measurements of distance).

Furthermore, the embodiments of the hybrid integrated photonic chip may include fewer components or additional components. Although these embodiments are illustrated as having a number of discrete items, these optical components, integrated circuits and the system are intended to be functional descriptions of the various features that may be present rather than structural schematics of the embodiments described herein. Consequently, in these embodiments two or more components may be combined into a single component, and/or a position of one or more components may be changed. In addition, functionality in the preceding embodiments of the hybrid integrated photonic chip may be implemented more in hardware and less in software, or less in hardware and more in software, as is known in the art.

In the preceding description, we refer to 'some embodiments.' Note that 'some embodiments' describes a subset of all of the possible embodiments, but does not always specify the same subset of embodiments.

Figure 9:
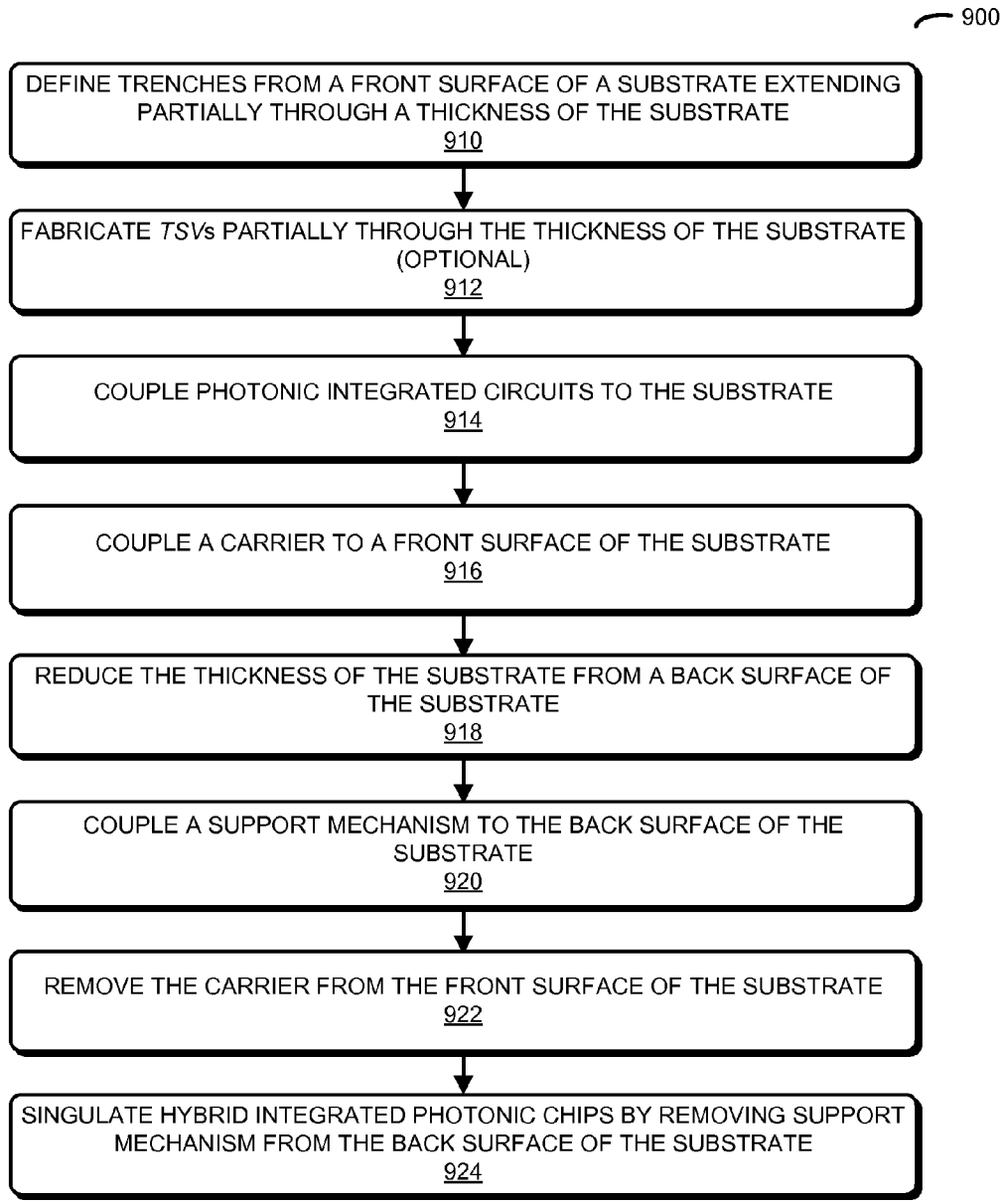
FIG. 9 is a flow chart illustrating a method for singulating hybrid integrated photonic chips in accordance with an embodiment of the present disclosure.

We now describe embodiments of the method. FIG. 9 presents a flow chart illustrating a method 900 for singulating hybrid integrated photonic chips. During the method, trenches are defined from a front surface of a substrate extending partially through a thickness of the substrate (operation 910). For example, the trenches may be defined using: partial dicing of the substrate; deep anisotropic etching; and/or laser cutting. Moreover, the substrate may include complementary-metal-oxide-semiconductor (CMOS) devices.

Then, photonic integrated circuits are coupled to the substrate (operation 914), where a given photonic integrated circuit has a front surface facing the front surface of the substrate, and where the given photonic circuit at least partially overlaps a given trench. Note that the photonic integrated circuits may be bonded to the substrate.

Moreover, a carrier is coupled to the front surface of the substrate (operation 916). For example, the carrier may be coupled to the substrate using an adhesive. In some embodiments, the carrier includes cavities, defined by edges, that at least partially surround the photonic integrated circuits.

Furthermore, the thickness of the substrate is reduced from a back surface of the substrate (operation 918). For example, the thickness of the substrate may be reduced using grinding.

Additionally, a support mechanism is coupled to the back surface of the substrate (operation 920), and the carrier is removed from the front surface of the substrate (operation 922). For example, the support mechanism may include tape.

Next, the hybrid integrated photonic chips are singulated by removing the support mechanism from the back surface of the substrate (operation 924), where a given hybrid integrated photonic chip includes a portion of the substrate and one of the photonic integrated circuits.

Additionally, prior to coupling the photonic integrated circuits to the substrate (operation 914), the method may optionally include fabricating TSVs partially through the thickness of the substrate (operation 912), where the TSVs have a depth that is greater than that of the trenches.

Figure 10A:
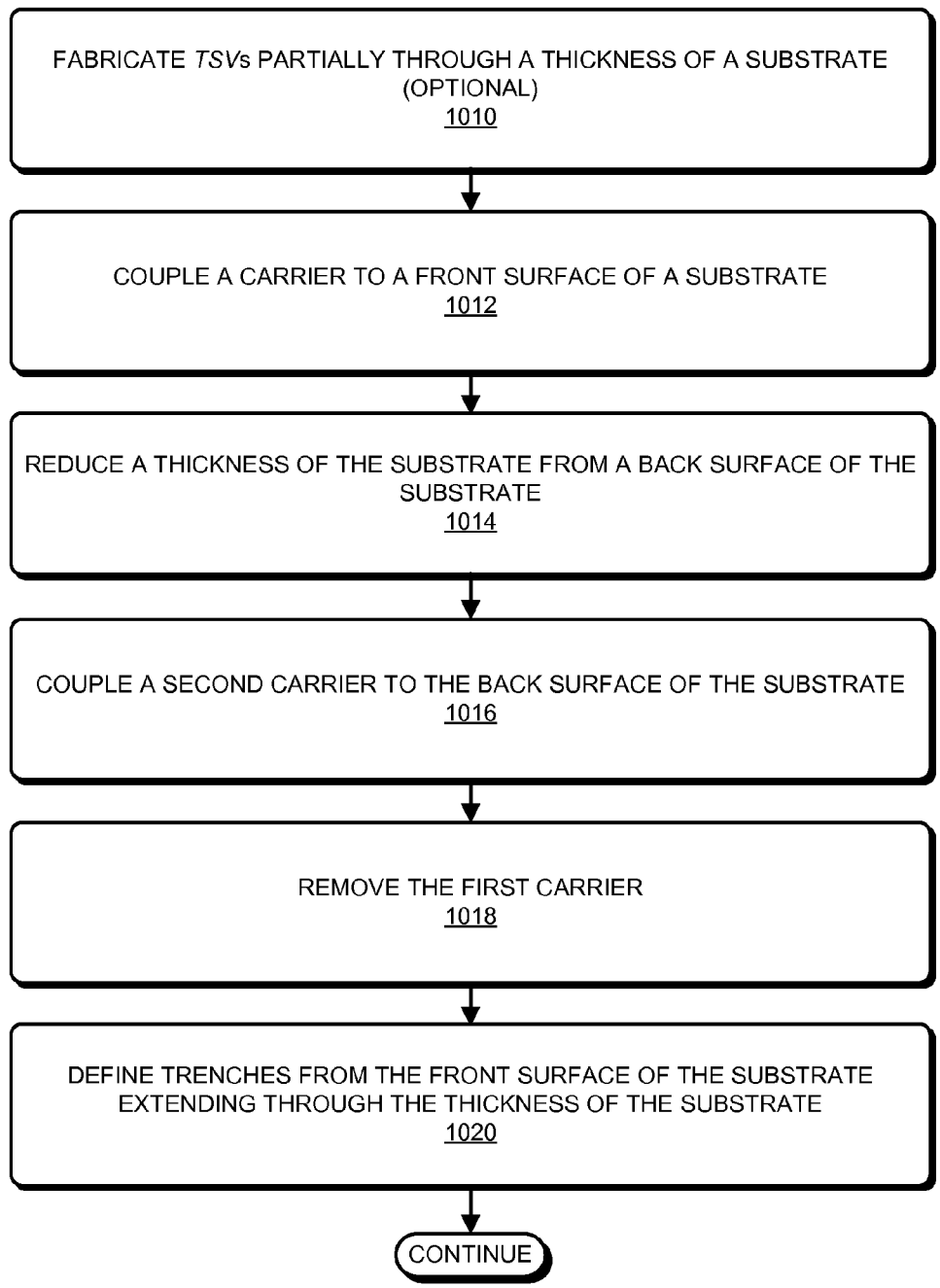
FIG. 10A is a flow chart illustrating a method for singulating hybrid integrated photonic chips in accordance with an embodiment of the present disclosure.
Figure 10B:
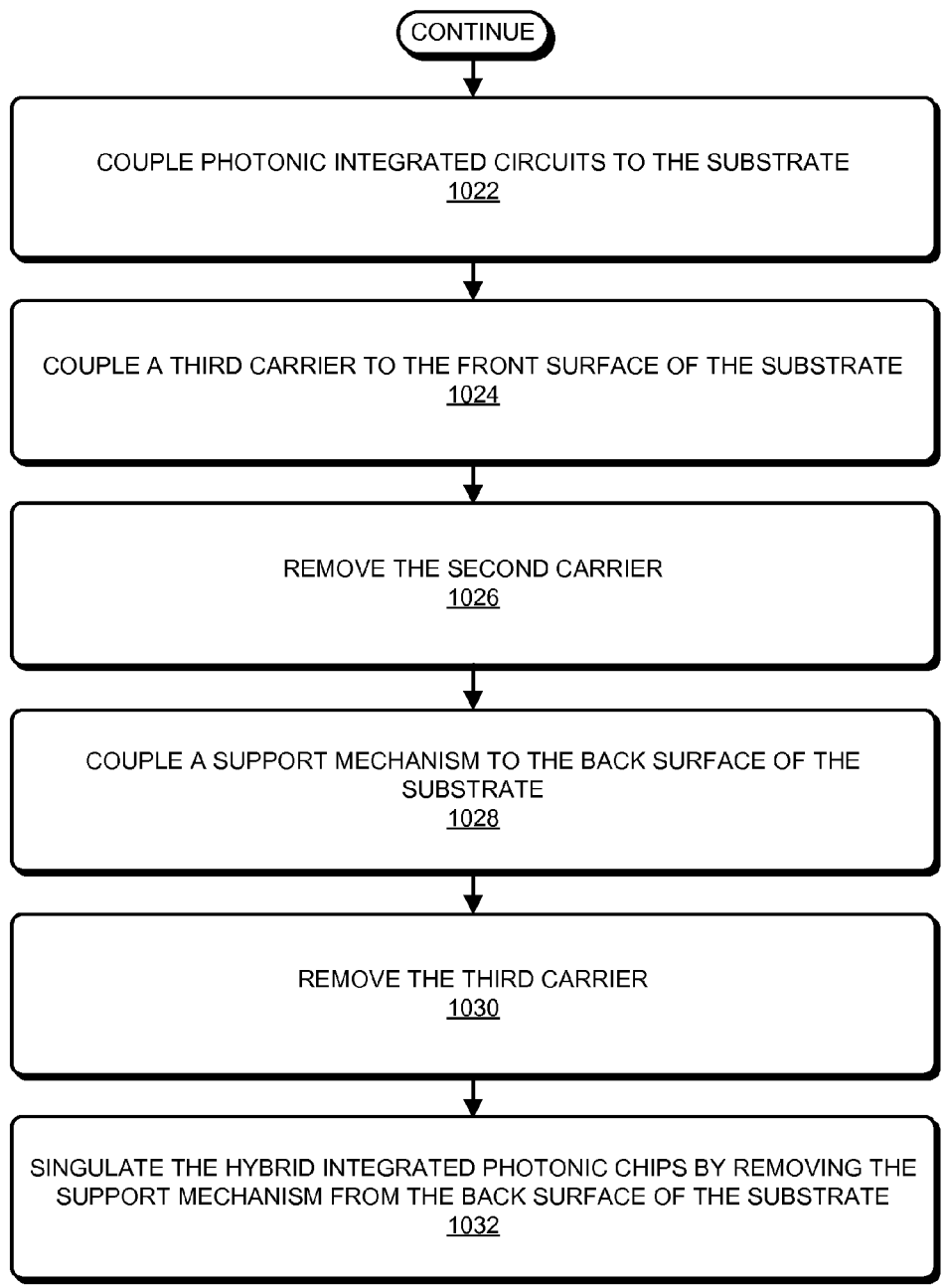
FIG. 10B is a flow chart illustrating a method for singulating hybrid integrated photonic chips in accordance with an embodiment of the present disclosure.

FIGS. 10A and 10B presents a flow chart illustrating a method 1000 for singulating hybrid integrated photonic chips. During the method, a first carrier is coupled to a front surface of a substrate (operation 1012), and a thickness of the substrate is reduced from a back surface of the substrate (operation 1014). For example, the thickness of the substrate may be reduced using grinding. Note that the substrate may include an interposer without CMOS devices.

Then, a second carrier is coupled to the back surface of the substrate (operation 1016), and the first carrier is removed (operation 1018).

Moreover, trenches are defined from the front surface extending through the thickness of the substrate (operation 1020). For example, the trenches may be defined using: dicing of the substrate; deep anisotropic etching; and/or laser cutting.

Furthermore, photonic integrated circuits are coupled to the substrate (operation 1022), where a given photonic integrated circuit has a front surface facing the front surface of the substrate, and where the given photonic circuit at least partially overlaps a given trench. Note that the photonic integrated circuits may be bonded to the substrate.

Furthermore, a third carrier is coupled to the front surface of the substrate (operation 1024), and the second carrier is removed (operation 1026). In some embodiments, the third carrier includes cavities, defined by edges, that at least partially surround the photonic integrated circuits.

Additionally, a support mechanism is coupled to the back surface of the substrate (operation 1028), and the third carrier is removed (operation 1030) from the front surface of the substrate. For example, the support mechanism may include tape.

Next, the hybrid integrated photonic chips are singulated by removing the support mechanism from the back surface of the substrate (operation 1032), where a given hybrid integrated photonic chip includes a portion of the substrate and one of the photonic integrated circuits.

Note that the coupling in operations 1012, 1016, 1022, 1024 and/or 1028 may use an adhesive.

Additionally, prior to coupling the first carrier to the front surface of the substrate (operation 1012), the method may optionally include fabricating TSVs partially through the thickness of the substrate (operation 1010), where the TSVs have a depth that is greater than that of the trenches.

In some embodiments of methods 900 (FIG. 9) and/or 1000, there are additional or fewer operations. Moreover, the order of the operations may be changed, and/or two or more operations may be combined into a single operation.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. A method for singulating hybrid integrated photonic chips, wherein the method comprises:
    defining trenches from a front surface of a substrate extending partially through a thickness of the substrate;
    coupling photonic integrated circuits to the substrate, wherein a given photonic integrated circuit has a front surface facing the front surface of the substrate, and wherein the given photonic circuit at least partially overlaps a given trench;
    coupling a carrier to the front surface of the substrate;
    reducing the thickness of the substrate from a back surface of the substrate;
    coupling a support mechanism to the back surface of the substrate;
    removing the carrier from the front surface of the substrate; and
    singulating the hybrid integrated photonic chips by removing the support mechanism from the back surface of the substrate, wherein a given hybrid integrated photonic chip includes a portion of the substrate and one of the photonic integrated circuits.

2. The method of claim 1, wherein the trenches are defined using one of: partial dicing of the substrate; deep anisotropic etching; and laser cutting.

3. The method of claim 1, wherein the substrate includes complementary-metal-oxide-semiconductor (CMOS) devices.

4. The method of claim 1, wherein the photonic integrated circuits are bonded to the substrate.

5. The method of claim 1, wherein the carrier is coupled to the substrate using an adhesive.

6. The method of claim 1, wherein the carrier includes cavities, defined by edges, that at least partially surround the photonic integrated circuits.

7. The method of claim 1, wherein the thickness of the substrate is reduced using grinding.

8. The method of claim 1, wherein the support mechanism includes tape.

9. The method of claim 1, wherein, prior to coupling the photonic integrated circuits to the substrate, the method further includes fabricating through-substrate vias (TSVs) partially through the thickness of the substrate.

10. A method for singulating hybrid chips from a wafer, wherein the method comprises:
    coupling a first carrier to a front surface of a substrate;
    reducing a thickness of the substrate from a back surface of the substrate;
    coupling a second carrier to the back surface of the substrate;
    removing the first carrier;
    defining trenches from the front surface extending through the thickness of the substrate;
    coupling photonic integrated circuits to the substrate, wherein a given photonic integrated circuit has a front surface facing the front surface of the substrate, and wherein the given photonic circuit at least partially overlaps a given trench;
    coupling a third carrier to the front surface of the substrate;
    removing the second carrier;
    coupling a support mechanism to the back surface of the substrate;
    removing the third carrier from the front surface of the substrate; and singulating the hybrid integrated photonic chips by removing the support mechanism from the back surface of the substrate, wherein a given hybrid integrated photonic chip includes a portion of the substrate and one of the photonic integrated circuits.

11. The method of claim 10, wherein the trenches are defined using one of: dicing of the substrate; deep anisotropic etching; and laser cutting.

12. The method of claim 10, wherein the substrate includes an interposer without complementary-metal-oxide-semiconductor (CMOS) devices.

13. The method of claim 10, wherein the photonic integrated circuits are bonded to the substrate.

14. The method of claim 10, wherein the coupling for a given carrier uses an adhesive.

15. The method of claim 10, wherein the third carrier includes cavities, defined by edges, that at least partially surround the photonic integrated circuits.

16. The method of claim 10, wherein the thickness of the substrate is reduced using grinding.

17. The method of claim 10, wherein the support mechanism includes tape.

18. The method of claim 10, wherein, prior to coupling the first carrier to the front surface of the substrate, the method further includes fabricating through-substrate vias (TSVs) partially through the thickness of the substrate.

* * * * *

UNITED STATES PATENT AND TRADEMARK OFFICE
CERTIFICATE OF CORRECTION

| | | |
|---|---|---|
| PATENT NO. | : 9,159,861 B2 | Page 1 of 1 |
| APPLICATION NO. | : 14/059288 | |
| DATED | : October 13, 2015 | |
| INVENTOR(S) | : Zhang et al. | |

It is certified that error appears in the above-identified patent and that said Letters Patent is hereby corrected as shown below:

In the specification

Column 2, line 41, delete "substrate. the" and insert -- substrate. The --, therefor.

Signed and Sealed this
Seventh Day of June, 2016

Michelle K. Lee
*Director of the United States Patent and Trademark Office*